(12) United States Patent
Taniguchi (10) Patent No.: US 10,741,745 B2
(45) Date of Patent: Aug. 11, 2020

(54) ELASTIC WAVE DEVICE

(71) Applicant: Murata Manufacturing Co., Ltd., Nagaokakyo-shi, Kyoto-fu (JP)

(72) Inventor: Yasumasa Taniguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 498 days.

(21) Appl. No.: 15/651,093

(22) Filed: Jul. 17, 2017

(65) Prior Publication Data

US 2018/0062063 A1    Mar. 1, 2018

(30) Foreign Application Priority Data

Aug. 29, 2016   (JP) ................................ 2016-166630

(51) Int. Cl.
| | | |
|---|---|---|
| *H03H 9/145* | (2006.01) | |
| *H01L 41/047* | (2006.01) | |
| *H03H 9/02* | (2006.01) | |
| *H03H 9/05* | (2006.01) | |
| *H03H 9/10* | (2006.01) | |
| *H01L 41/053* | (2006.01) | |
| *H01L 41/107* | (2006.01) | |
| *H01L 41/35* | (2013.01) | |

(52) U.S. Cl.
CPC ........ *H01L 41/047* (2013.01); *H01L 41/0533* (2013.01); *H01L 41/107* (2013.01); *H01L 41/35* (2013.01); *H03H 9/02622* (2013.01); *H03H 9/02818* (2013.01); *H03H 9/059* (2013.01); *H03H 9/1071* (2013.01); *H03H 9/14541* (2013.01)

(58) Field of Classification Search
CPC .......... H03H 9/02622; H03H 9/02818; H03H 9/059; H03H 9/1071; H03H 9/14541; H01L 41/047; H01L 41/0533
See application file for complete search history.

(56) References Cited

U.S. PATENT DOCUMENTS

| | | | | |
|---|---|---|---|---|
| 3,753,164 A | * | 8/1973 | De Vries ............ | H03H 9/02622 333/153 |
| 3,781,721 A | * | 12/1973 | Judd .................. | H03H 9/02622 333/151 |
| 4,163,201 A | * | 7/1979 | Takahashi .......... | H03H 9/02559 252/62.9 R |
| 4,406,964 A | * | 9/1983 | Chiba ................ | H03H 9/02637 310/313 B |

(Continued)

FOREIGN PATENT DOCUMENTS

JP       2001044787 A  *  2/2001

*Primary Examiner* — J. San Martin
(74) *Attorney, Agent, or Firm* — Keating & Bennett, LLP (57) ABSTRACT

An elastic wave device includes a piezoelectric substrate with first and second main surfaces internally facing each other, an elastic-wave element that includes an interdigital transducer electrode provided on or in the first main surface of the piezoelectric substrate, and a first protective film that is provided on the first main surface of the piezoelectric substrate so as to cover the IDT electrode. The IDT electrode includes a main electrode layer made of a metal having a density higher than that of the first protective film. The piezoelectric substrate has a thickness of about 0.35 mm or smaller, and irregularities are located on the second main surface.

19 Claims, 6 Drawing Sheets

(56) References Cited

U.S. PATENT DOCUMENTS

| | | | | |
|---|---|---|---|---|
| 5,329,208 | A | * | 7/1994 | Imai .................... H03H 9/02582 |
| | | | | 310/313 A |
| 5,838,217 | A | * | 11/1998 | Kadota .............. H03H 9/02669 |
| | | | | 333/193 |
| 2003/0127943 | A1 | * | 7/2003 | Tsuzuki ................... H03H 3/08 |
| | | | | 310/313 R |
| 2004/0041496 | A1 | * | 3/2004 | Imai ........................ H03H 3/10 |
| | | | | 310/313 D |
| 2005/0200434 | A1 | * | 9/2005 | Takano .................... H03H 3/08 |
| | | | | 333/193 |
| 2006/0022768 | A1 | * | 2/2006 | Yokota ............... H03H 9/02574 |
| | | | | 333/133 |
| 2009/0072659 | A1 | * | 3/2009 | Nishiyama ......... H03H 9/02559 |
| | | | | 310/313 B |
| 2010/0045145 | A1 | * | 2/2010 | Tsuda ....................... H03H 3/08 |
| | | | | 310/365 |
| 2014/0145557 | A1 | * | 5/2014 | Tanaka ................... H03H 9/059 |
| | | | | 310/313 D |

* cited by examiner

ELASTIC WAVE DEVICE

CROSS REFERENCE TO RELATED APPLICATIONS

This application claims the benefit of priority to Japanese Patent Application No. 2016-166630 filed on Aug. 29, 2016. The entire contents of this application are hereby incorporated herein by reference.

BACKGROUND OF THE INVENTION

1. Field of the Invention

The present invention relates to an elastic wave device.

2. Description of the Related Art

In the related art, elastic wave devices have been widely used as, for example, filters of cellular phones. Japanese Unexamined Patent Application Publication No. 2012-209841 discloses an example of an elastic wave device having a wafer level package (WLP) structure. In the elastic wave device of Japanese Unexamined Patent Application Publication No. 2012-209841, a protective layer is provided on a piezoelectric substrate so as to cover an interdigital transducer (IDT) electrode. As a result, variations in the electrical characteristics of the elastic wave device according to temperature changes are suppressed. The thickness of the piezoelectric substrate is set to about 0.2 mm to about 0.5 mm such that a reduction in the height of the elastic wave device is achieved.

In an elastic wave device including a protective layer such as that described in Japanese Unexamined Patent Application Publication No. 2012-209841, in the case where an IDT electrode is made of a metal having a low density, such as Al, the reflection coefficient of the IDT electrode is insufficient. Thus, the electrical characteristics of the elastic wave device are likely to deteriorate. Accordingly, IDT electrodes made of Pt or the like and having a large reflection coefficient have been widely used in ladder filters, longitudinally coupled resonator elastic wave filters, and the like in each of which an elastic wave is confined to a surface of an IDT electrode.

However, an elastic wave device such as that described above, which includes an IDT electrode made of a metal having a high density, is unlikely to be influenced by a bulk wave, and on the other hand, harmonic distortion may sometimes be generated when a large power is supplied to the elastic wave device. Harmonic distortion is likely to be generated especially in the case where the thickness of a piezoelectric substrate is small.

SUMMARY OF THE INVENTION

Accordingly, preferred embodiments of the present invention provide elastic wave devices capable of facilitating a height reduction, sufficiently increasing a reflection coefficient, and suppressing harmonic distortion.

An elastic wave device according to a preferred embodiment of the present invention includes a piezoelectric substrate that includes first and second main surfaces internally facing each other, an elastic-wave element that includes an interdigital transducer (IDT) electrode provided on or in the first main surface of the piezoelectric substrate, and a protective film that is provided on the first main surface of the piezoelectric substrate so as to cover the IDT electrode. The IDT electrode includes a main electrode layer made of a metal having a density higher than a density of the protective film. The piezoelectric substrate preferably has a thickness of about 0.35 mm or smaller, and irregularities are located on the second main surface.

In an elastic wave device according to a preferred embodiment of the present invention, the elastic-wave element defines one of a ladder filter or a longitudinally coupled resonator elastic wave filter.

In an elastic wave device according to another preferred embodiment of the present invention, the thickness of the piezoelectric substrate preferably is about 0.18 mm or smaller. In this case, the influence of harmonic distortion in a pass band is further easily reduced. In addition, a reduction in the height of the elastic wave device is further facilitated.

In the elastic wave device according to another preferred embodiment of the present invention, the elastic wave device is connected to an antenna, and when a wavelength of an elastic wave defined by a pitch of electrode fingers of the IDT electrode is $\lambda$, the thickness of the elastic-wave element that is closest to the antenna preferably is about $42\lambda$ or smaller. In this case, the influence of harmonic distortion in a pass band is further easily reduced. In addition, a reduction in the height of the elastic wave device is further facilitated.

In an elastic wave device according to another preferred embodiment of the present invention, an arithmetic mean roughness (Ra) of the irregularities on the second main surface of the piezoelectric substrate preferably is about 115 nm or larger and about 2,000 nm or smaller. In this case, harmonic distortion is further suppressed, and cracks and chips are less likely to occur in the piezoelectric substrate.

In an elastic wave device according to another preferred embodiment of the present invention, one of a Rayleigh wave and a Love wave is used.

In an elastic wave device according to another preferred embodiment of the present invention, the protective film includes a silicon oxide as a main component. In this case, variations in the electrical characteristics of the elastic wave device according to temperature changes are significantly reduced or prevented.

In the preferred embodiments of the present invention, elastic wave devices capable of facilitating height reduction, sufficiently increasing the reflection coefficient, and suppressing harmonic distortion are provided.

The above and other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

Specific preferred embodiments of the present invention will be described below with reference to the drawings to clarify the present invention.

Note that the preferred embodiments described in the present specification are examples, and it is to be noted that the configurations according to the different preferred embodiments may be partially replaced with one another or may be combined with each other.

Figure 1:
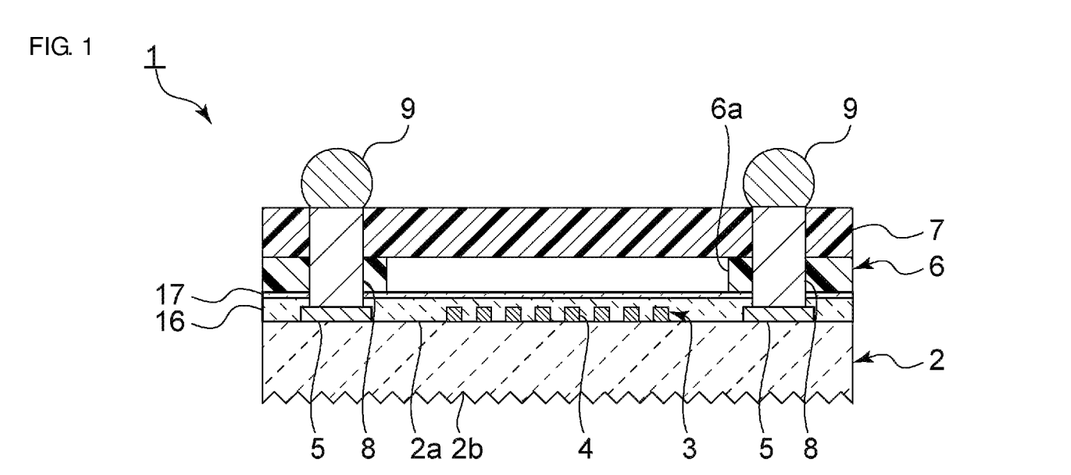
FIG. 1 is a sectional front view of an elastic wave device according to a preferred embodiment of the present invention.

FIG. 1 is a sectional front view of an elastic wave device according to a preferred embodiment of the present invention.

An elastic wave device 1 includes a piezoelectric substrate 2. The piezoelectric substrate 2 includes first and second main surfaces 2a and 2b internally facing each other. Irregularities are located on the second main surface 2b. The irregularities are preferably formed by performing surface roughening on the second main surface 2b of the piezoelectric substrate 2. Although the surface roughening is not particularly limited, examples of the surface roughening include grinding and the like.

The thickness of the piezoelectric substrate 2 preferably is set to about 0.35 mm or smaller, for example. As a result, a reduction in the height of the elastic wave device 1 is facilitated. In the present preferred embodiment, the piezoelectric substrate 2 preferably is a Y-cut X-propagation LiNbO$_3$ substrate having a cut angle of about 128.5°, for example. Note that the cut angle of the piezoelectric substrate 2 is not limited to the above-mentioned angle. The piezoelectric substrate 2 may be made of a piezoelectric single crystal, such as LiTaO$_3$, excluding LiNbO$_3$ or a suitable piezoelectric ceramic.

An elastic-wave element 3 is provided on or in the first main surface 2a of the piezoelectric substrate 2. Although not particularly limited, the elastic-wave element 3 according to the present preferred embodiment is an elastic wave filter that is connected to an antenna. It is preferable that the elastic-wave element 3 define one of a ladder filter and a longitudinally coupled resonator elastic wave filter.

Note that, in the present specification, in the case where the elastic-wave element 3 is a longitudinally coupled resonator elastic wave filter, the elastic-wave element 3 may include an elastic wave resonator for characteristic adjustment.

The elastic-wave element 3 includes an interdigital transducer (IDT) electrode 4 disposed on the first main surface 2a. Electrode lands 5 that are electrically connected to the IDT electrode 4 are disposed on the first main surface 2a. An elastic wave is excited as a result of an alternating-current voltage being applied to the IDT electrode 4. In the present preferred embodiment, the wavelength λ of the elastic wave, which is defined by the pitch of electrode fingers of the IDT electrode 4, preferably is about 4.3 μm, for example. Note that the value of the wavelength λ is not limited to the above-mentioned value.

The elastic wave device 1 uses a Rayleigh wave. It is preferable that the elastic wave used by the elastic wave device 1 be one of a Rayleigh wave and a Love wave.

A first protective film 16 is provided on the first main surface 2a of the piezoelectric substrate 2 so as to cover the IDT electrode 4. The first protective film 16 is made of SiO$_2$. As a result, variations in the electrical characteristics of the elastic wave device 1 according to temperature changes are significantly reduced or prevented. In the present preferred embodiment, the first protective film 16 is a temperature compensation film.

A dielectric material containing, as a main component, a silicon oxide other than SiO$_2$ may be used as the material of the first protective film 16 defining and functioning as a temperature compensation film. Here, a film that is made of a dielectric material containing a silicon oxide as a main component refers to a film that is made of a dielectric material not limited to containing SiO$_2$ but containing more than about 50 wt % of SiO$_x$ (x is an integer), for example. Note that the first protective film 16 may be made of a suitable dielectric material other than a silicon oxide. The first protective film 16 is not limited to a temperature compensation film.

A second protective film 17 is provided on the first protective film 16. In the present preferred embodiment, the second protective film 17 is made of SiN. The second protective film 17 is a frequency adjustment film. Note that the second protective film 17 may be made of a suitable dielectric material other than SiN. The second protective film 17 is not limited to being a frequency adjustment film. For example, the first protective film 16 may define to a protective film, and the second protective film 17 does not need to be provided.

The IDT electrode 4 includes a main electrode layer made of a metal having a density higher than that of the first protective film 16. More specifically, in the present preferred embodiment, the main electrode layer is made of Pt. Note that, in the present specification, the main electrode layer refers to an electrode layer that is dominant in excitation of an elastic wave.

As illustrated in FIG. 1, the elastic wave device 1 is an elastic wave device having a WLP structure. More specifically, a support 6 is disposed on the first main surface 2a of the piezoelectric substrate 2 with the first and second protective films 16 and 17 interposed therebetween. The support 6 includes a cavity 6a. The cavity 6a surrounds the IDT electrode 4 when viewed in plan view. The support 6 covers the electrode lands 5 when viewed in plan view.

Note that the support 6 may be disposed directly on the first main surface 2a. In this case, the first and second protective films 16 and 17 are positioned in the cavity 6a, and the electrode lands 5 are covered with the support 6.

In the elastic wave device 1, a cover 7 is disposed on the support 6 so as to cover the cavity 6a. The IDT electrode 4 is disposed in a hollow space formed and defined by the piezoelectric substrate 2, the support 6, and the cover 7.

Via electrodes 8 each extending through the support 6 and the cover 7 are provided, and a first end of each of the via electrodes 8 is connected to a corresponding one of the electrode lands 5. Bumps 9 are joined to second ends of the via electrodes 8. The elastic wave device 1 is mounted onto a mounting substrate or the like via the bumps 9. The IDT electrode 4 is electrically connected to the outside via the electrode lands 5, the via electrodes 8, and the bumps 9.

Note that an elastic wave device according to a preferred embodiment of the present invention does not need to be an elastic wave device having a WLP structure and may be, for example, an elastic wave device having a chip size package (CSP) structure.

The present preferred embodiment preferably includes the following features: the thickness of the piezoelectric substrate 2 is about 0.35 mm or smaller, the first protective film 16 is provided, the IDT electrode 4 includes the main electrode layer made of a metal having a density higher than that of the first protective film 16, and irregularities are located on the second main surface 2b. As a result, a reduction in the height of the elastic wave device 1 is facilitated, and the reflection coefficient is sufficiently increased. In addition, harmonic distortion is suppressed. This matter will now be described together with details of the present preferred embodiment.

Figure 2:
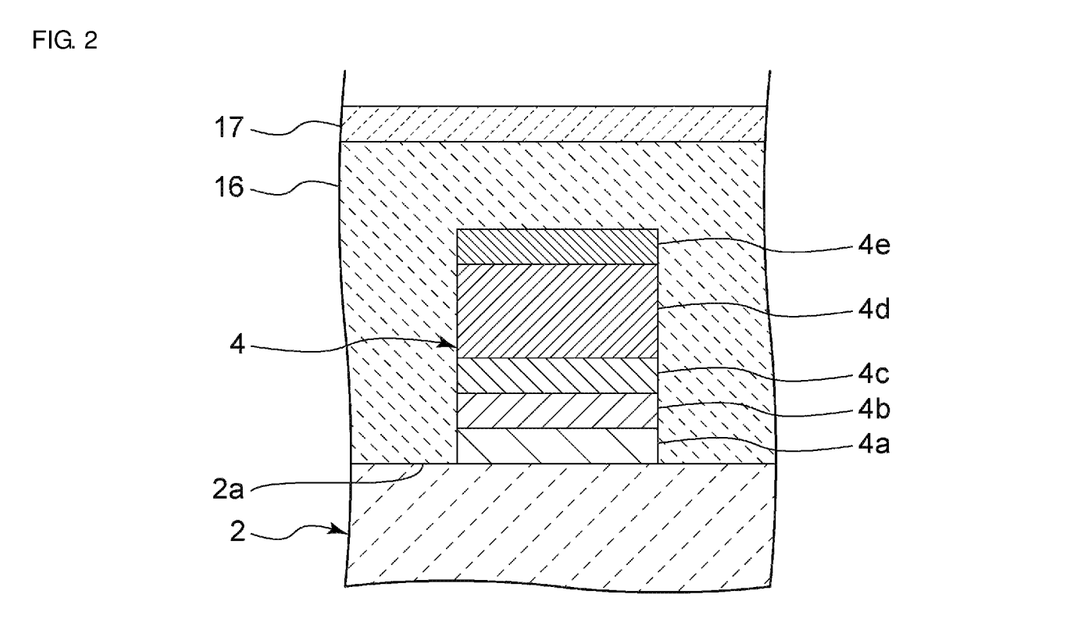
FIG. 2 is an enlarged sectional front view of an electrode finger of an IDT electrode according to a preferred embodiment of the present invention.

FIG. 2 is an enlarged sectional front view of one of the electrode fingers of the IDT electrode 4 according to the present preferred embodiment.

As illustrated in FIG. 2, the IDT electrode 4 includes a multilayer metal film including a plurality of metal layers laminated together. More specifically, the IDT electrode 4 includes a first metal layer 4a, a second metal layer 4b, which corresponds to the above-mentioned main electrode layer, and third to fifth metal layers 4c to 4e. The first to fifth metal layers 4a to 4e are laminated on the first main surface 2a of the piezoelectric substrate 2 in this order.

In the present preferred embodiment, although the material of the first metal layer 4a is not particularly limited, the first metal layer 4a is made of NiCr. It is preferable that the first metal layer 4a be made of a metal having an adhesive strength with respect to the piezoelectric substrate 2 higher than that of the second metal layer 4b.

As mentioned above, the second metal layer 4b is made of Pt. Note that the material of the second metal layer 4b is not limited to the above as long as the second metal layer 4b is made of, for example, a metal such as Au, Ag, Cu, Ta, W, Ni, Mo, or Ti having a density higher than that of the first protective film 16. As a result, the reflection coefficient is sufficiently increased. Consequently, a signal is able to be effectively confined to a surface of the IDT electrode 4.

Although the material of the third metal layer 4c is not particularly limited, the third metal layer 4c is made of Ti. As a result of providing the third metal layer 4c, interdiffusion between the second metal layer 4b and the fourth metal layer 4d is unlikely to occur. Although the material of the fourth metal layer 4d is not particularly limited, the fourth metal layer 4d is made of AlCu. It is preferable that the fourth metal layer 4d be made of a metal having an electrical conductivity higher than that of the second metal layer 4b. Although the material of the fifth metal layer 4e is not particularly limited, the fifth metal layer 4e is made of Ti. It is preferable that the fifth metal layer 4e be made of, for example, a metal having high corrosion resistance. As a result, the IDT electrode 4 is less likely to deteriorate.

Note that the IDT electrode 4 is not limited to having the above-described configuration, in which the IDT electrode 4 includes the first to fifth metal layers 4a to 4e. For example, the IDT electrode 4 may include only the main electrode layer.

It will be demonstrated below that harmonic distortion is effectively suppressed in the present preferred embodiment by comparing the present preferred embodiment and a comparative example.

A plurality of elastic wave devices each having the configuration according to the present preferred embodiment were fabricated such that piezoelectric substrates of the elastic wave devices had different thicknesses and that each of second main surfaces of the elastic wave devices had a different arithmetic surface roughness Ra. Meanwhile, a plurality of elastic wave devices according to the comparative example were fabricated such that piezoelectric substrates of the elastic wave devices had different thicknesses. Each of the elastic wave devices according to the comparative example has a configuration similar to that according to the present preferred embodiment except that irregularities are not located or provided on a second main surface of a piezoelectric substrate. Note that mirror-surface treatment has been performed on each of the second main surfaces according to the comparative example.

Here, in the present specification, the arithmetic mean roughness Ra refers to arithmetic mean roughness Ra specified in JIS B 0601:2013.

Third harmonic distortion levels in the elastic wave devices were evaluated. More specifically, the third harmonic distortion levels were measured by inputting a power of 15 dBm at different frequencies. The following table shows the thicknesses of the piezoelectric substrates of the elastic wave devices, the arithmetic roughnesses Ra|[A1] of the second main surfaces, and peak levels and peak intervals Δf of the third harmonic distortion. FIG. 3 to FIG. 8 illustrate the relationship between input power frequency and third harmonic distortion level in the elastic wave devices.

|  | Preferred Embodiment | | | | Comparative Example | |
|---|---|---|---|---|---|---|
|  | A | B | C | D | E | F |
| Thickness of Piezoelectric Substrate (mm) | 0.125 | 0.2 | 0.35 | 0.35 | 0.125 | 0.2 |
| Arithmetic Surface Roughness Ra of Second Main Surface (nm) | 115 | 1,000 | 1,000 | 2,000 | 35 | 35 |
| Peak Level (dBm) | −102.7 | −107.9 | −109.3 | −118.3 | −93.5 | −92.1 |
| Peak Interval Δf (MHz) | 14 | 9 | 9 | — | 14 | 9 |

Results A to D in the above table correspond to the elastic wave devices according to the present preferred embodiment of the present invention, and results E and F correspond to the elastic wave devices according to the comparative example. When there are a plurality of peaks of the third harmonic distortion in each of the results, the largest peak level is shown in the above table. Note that only the result D has one peak. In the comparative example, mirror-surface treatment has been performed on each of the second main surfaces such that the arithmetic surface roughness Ra of the second main surface is set to 35 nm.

Figure 3:
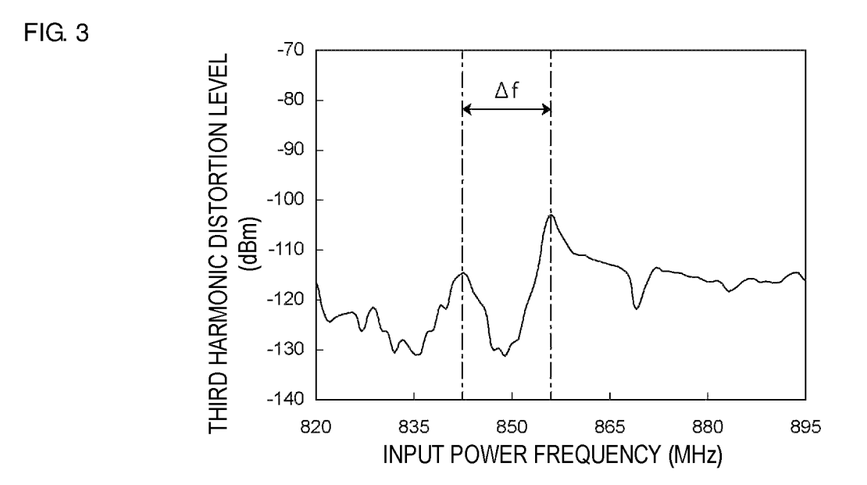
FIG. 3 is a graph illustrating a relationship between input power frequency and third harmonic distortion level in an elastic wave device according to a preferred embodiment of the present invention in which the thickness of a piezoelectric substrate is set to about 0.125 mm and in which the arithmetic surface roughness Ra of a second main surface of the piezoelectric substrate is set to about 115 nm.
Figure 4:
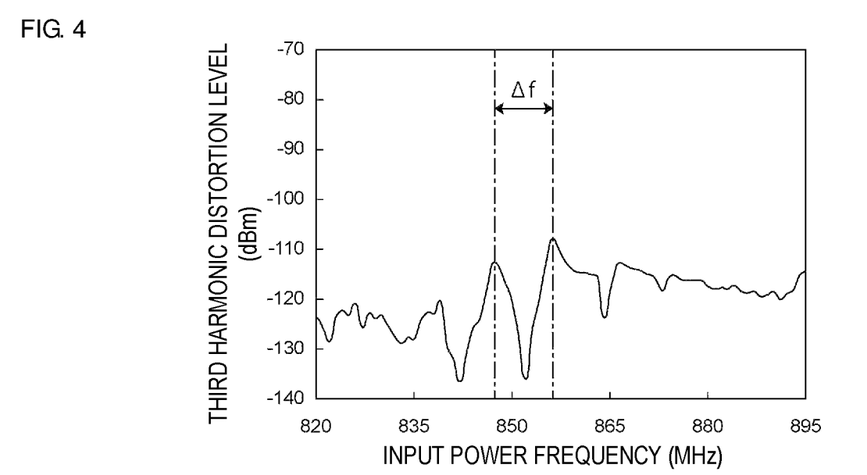
FIG. 4 is a graph illustrating the relationship between input power frequency and third harmonic distortion level in an elastic wave device according to a preferred embodiment of the present invention in which the thickness of a piezoelectric substrate is set to about 0.2 mm and in which the arithmetic surface roughness Ra of a second main surface of the piezoelectric substrate is set to about 1,000 nm.
Figure 5:
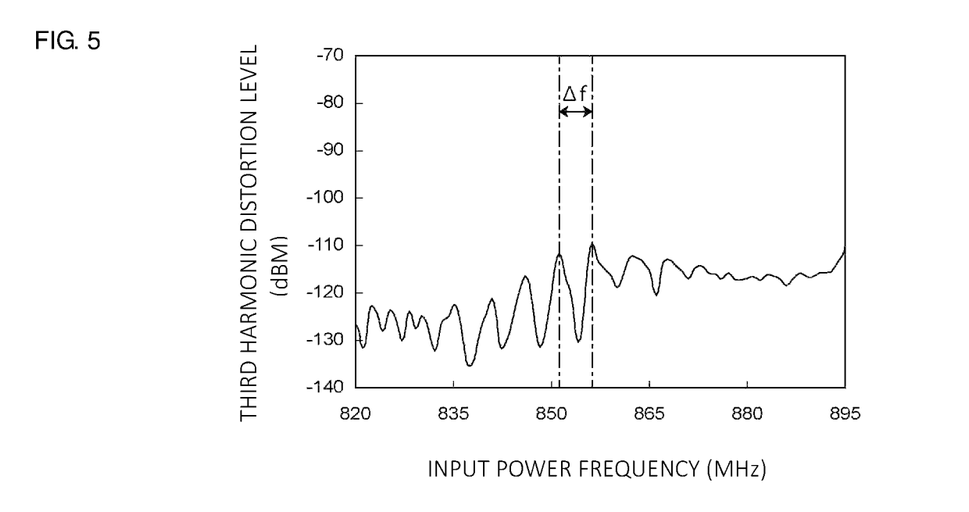
FIG. 5 is a graph illustrating the relationship between input power frequency and third harmonic distortion level in an elastic wave device according to a preferred embodiment of the present invention in which the thickness of a piezoelectric substrate is set to about 0.35 mm and in which the arithmetic surface roughness Ra of a second main surface of the piezoelectric substrate is set to about 1,000 nm.
Figure 6:
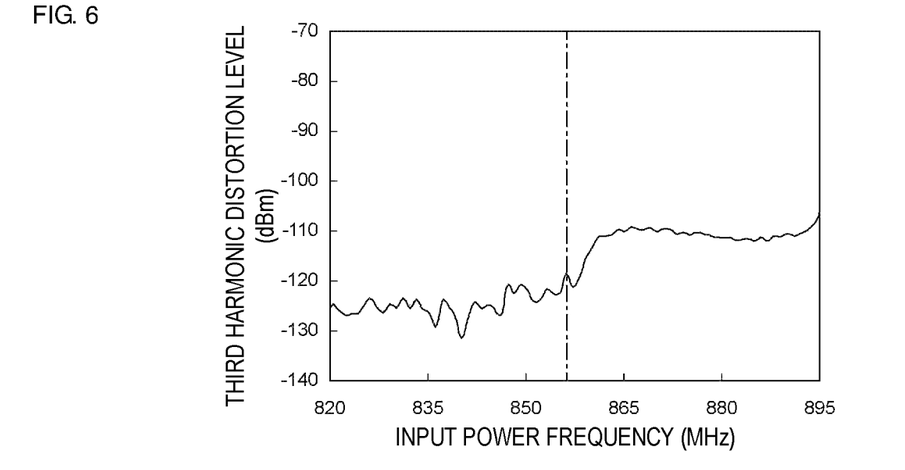
FIG. 6 is a graph illustrating the relationship between input power frequency and third harmonic distortion level in an elastic wave device according to a preferred embodiment of the present invention in which the thickness of a piezoelectric substrate is set to about 0.35 mm and in which the arithmetic surface roughness Ra of a second main surface of the piezoelectric substrate is set to about 2,000 nm.

FIG. 3 is a graph illustrating the relationship between input power frequency and third harmonic distortion level in the elastic wave device according to the present preferred embodiment in which the thickness of the piezoelectric substrate is set to about 0.125 mm and in which the arithmetic surface roughness Ra of the second main surface is set to about 115 nm, for example. FIG. 4 is a graph illustrating the relationship between input power frequency and third harmonic distortion level in the elastic wave device according to the present preferred embodiment in which the thickness of the piezoelectric substrate is set to about 0.2 mm and in which the arithmetic surface roughness Ra of the second main surface is set to about 1,000 nm, for example. FIG. 5 is a graph illustrating the relationship between input power frequency and third harmonic distortion level in the elastic wave device according to the present preferred embodiment in which the thickness of the piezoelectric substrate is set to about 0.35 mm and in which the arithmetic surface roughness Ra of the second main surface is set to about 1,000 nm, for example. FIG. 6 is a graph illustrating the relationship between input power frequency and third harmonic distortion level in the elastic wave device according to the present preferred embodiment in which the thickness of the piezoelectric substrate is set to about 0.35 mm and in which the arithmetic surface roughness Ra of the second main surface is set to about 2,000 nm, for example.

FIG. 3 corresponds to the result A in the above table. FIG. 4 corresponds to the result B in the above table. FIG. 5 corresponds to the result C in the above table. FIG. 6 corresponds to the result D in the above table. The one-dot chain lines in FIG. 3 to FIG. 6 each indicate the input power frequency at which the third harmonic distortion level reaches its peak. The same applies to FIG. 7, FIG. 8, and FIG. 10, which will be described below.

Figure 7:
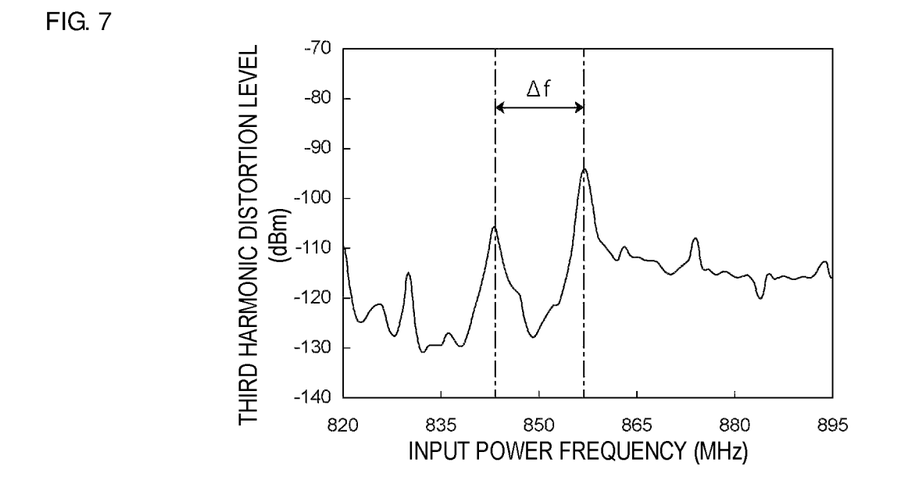
FIG. 7 is a graph illustrating the relationship between input power frequency and third harmonic distortion level in an elastic wave device according to a comparative example in which the thickness of a piezoelectric substrate is set to 0.125 mm.
Figure 8:
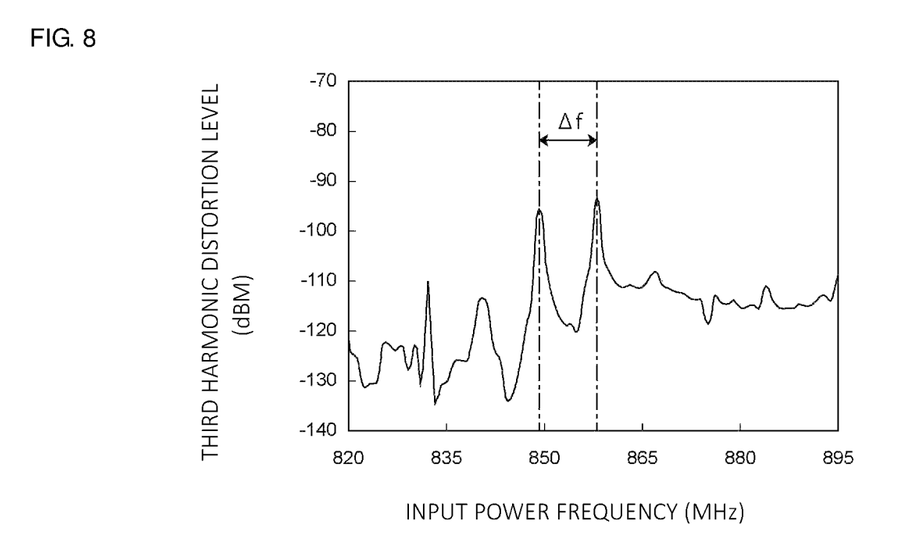
FIG. 8 is a graph illustrating the relationship between input power frequency and third harmonic distortion level in an elastic wave device according to a comparative example in which the thickness of a piezoelectric substrate is set to 0.2 mm.

FIG. 7 is a graph illustrating the relationship between input power frequency and third harmonic distortion level in the elastic wave device according to the comparative example in which the thickness of the piezoelectric substrate is set to 0.125 mm. FIG. 8 is a graph illustrating the relationship between input power frequency and third harmonic distortion level in the elastic wave device according to the comparative example in which the thickness of the piezoelectric substrate is set to 0.2 mm. FIG. 7 corresponds to the result E in the above table. FIG. 8 corresponds to the result F in the above table.

A reduction in the height of an elastic wave device is facilitated, and the reflection coefficient is increased in the case where the thickness of a piezoelectric substrate is small and where an IDT electrode made of a metal having a high density is used in the elastic wave device. However, as illustrated in FIG. 7, FIG. 8, and the above table, each of the peak levels of the third harmonic distortion in the results E and F corresponding to the comparative example is larger than −100. In the case where the peak level is larger than −100, the electrical characteristics of the elastic wave device often markedly deteriorate.

In contrast, in the present preferred embodiment, irregularities are located on the second main surface of the piezoelectric substrate by surface roughening. As illustrated in FIG. 3 to FIG. 6 and the above table, each of the peak levels of the third harmonic distortion in the results A to D, which correspond to the present preferred embodiment, is smaller than −100. As described above, according to the present preferred embodiment, a reduction in the height of the elastic wave device is facilitated, and the reflection coefficient can be increased. In addition, harmonic distortion is effectively suppressed.

It is preferable that the arithmetic surface roughness Ra of the second main surface of the piezoelectric substrate be about 115 nm or larger, and more preferably, about 1,000 nm or larger, for example. As a result, the harmonic distortion is further suppressed. As illustrated in FIG. 6, in the case where the arithmetic surface roughness Ra of the second main surface is about 2,000 nm, the peak level of the third harmonic distortion is particularly small, and there is one peak of the third harmonic distortion.

It is preferable that the arithmetic surface roughness Ra of the second main surface be about 2,000 nm or smaller, for example. As a result, the mechanical strength of the piezoelectric substrate is effectively improved, and cracks and chips are less likely to occur in the piezoelectric substrate.

The relationship between the thickness of a piezoelectric substrate and the peak interval of third harmonic distortion will now be described using the results shown in the above table. Note that the thickness of the piezoelectric substrate is defined as a thickness t normalized by the above-mentioned wavelength λ.

Figure 9:
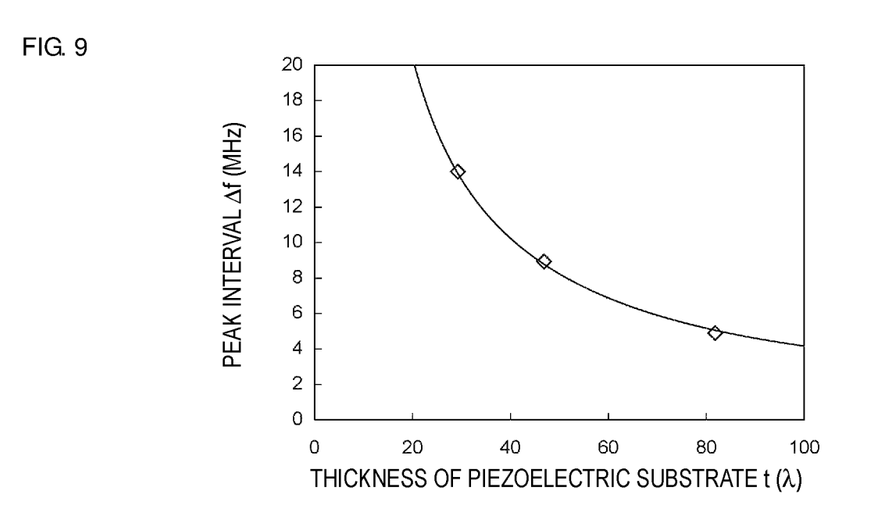
FIG. 9 is a graph illustrating the relationship between the thickness of the piezoelectric substrate and the peak interval of third harmonic distortion in the elastic wave device according to a preferred embodiment of the present invention.

FIG. 9 is a graph illustrating the relationship between the thickness of the piezoelectric substrate and the peak interval of third harmonic distortion in the elastic wave device according to the first preferred embodiment.

As illustrated in FIG. 9, it is understood that the peak interval Δf increases as the thickness t of the piezoelectric substrate is decreased. This relationship can be expressed by an approximate expression of $\Delta f = 419/t$. By increasing the peak interval Δf, for example, the pass band of an elastic wave filter is easily arranged in the frequency band between the frequencies at each of which the third harmonic distortion reaches its peak. In this case, the influence of third harmonic distortion in the pass band is easily reduced. It is preferable that the thickness t of the piezoelectric substrate be 42λ or smaller, for example. As a result, the peak interval Δf can be set to about 10 MHz or larger, for example. Therefore, the influence of the third harmonic distortion in the pass band is further easily reduced.

Figure 10:
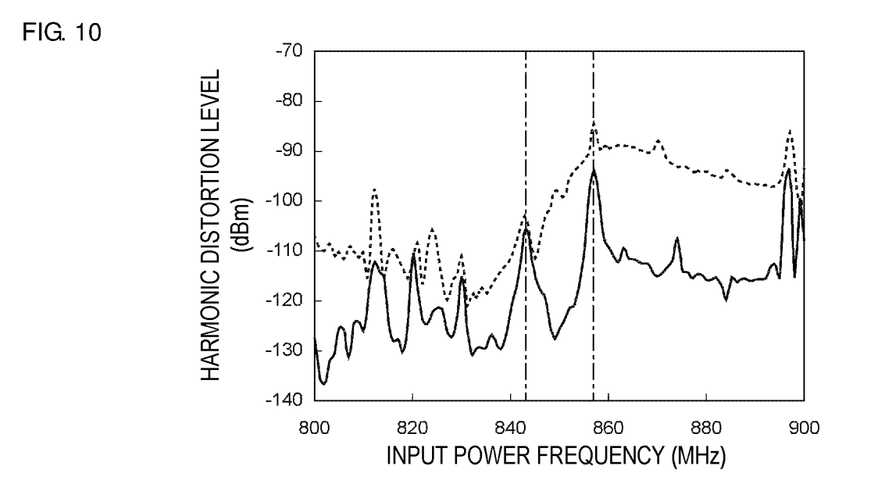
FIG. 10 is a graph illustrating a relationship between input power frequency and harmonic distortion level in the elastic wave device according to a comparative example.

Although the relationships between input power frequency and third harmonic distortion level are illustrated in FIG. 3 to FIG. 8, as illustrated in FIG. 10, the frequencies at each of which a second harmonic distortion level reaches its peak match the frequencies at each of which the third harmonic distortion level reaches its peak. Note that, in FIG. 10, the third harmonic distortion level is indicated by a solid line, and the second harmonic distortion level is indicated by a dashed line. Although not illustrated, input power frequencies at which other harmonic distortion levels reach their peaks also match the frequencies at each of which the third harmonic distortion level reaches its peak. As described above, by setting the thickness of the piezoelectric substrate to 42λ or smaller, the influences of other harmonic distortions other than the third harmonic distortion in the pass band are also reduced.

Note that, in the above-described preferred embodiment, λ is set to about 4.3 μm, and thus, it is preferable that the thickness of the piezoelectric substrate 2 illustrated in FIG. 1 be set to about 0.18 mm, for example. Also in this case, in a manner similar to the above, the influence of harmonic distortion in the pass band is further easily reduced. In addition, a reduction in the height of the elastic wave device 1 is further facilitated.

In the case where the elastic-wave element 3 is a ladder filter or a longitudinally coupled resonator elastic wave filter, the elastic-wave element 3 includes a plurality of IDT electrodes 4. The wavelength λ of each of the IDT electrodes 4 may be suitably selected in accordance with desired characteristics. In this case, it is preferable that the wavelength λ of one of the IDT electrodes 4, the IDT electrode 4 being closest to the antenna, of an elastic wave resonator or of a longitudinally coupled resonator elastic wave filter be used for normalization of the thickness of the piezoelectric substrate 2, such as that described above. As a result, harmonic distortion is further suppressed.

For example, in a front-end module of a cellular phone, a large power is often applied. In the elastic wave device according to the above-described preferred embodiment, the influence of harmonic distortion is effectively reduced also in the case where a large power is applied. As described above, preferred embodiments of the present invention can also be appropriately applied to a front-end module and the like.

A bulk wave is known as a factor in deterioration of the electrical characteristics of an elastic wave device. The influence of a bulk wave is likely to be reduced by increasing the thickness of a piezoelectric substrate. In contrast, in ladder filters and longitudinally coupled resonator filters, each of which uses a Rayleigh wave or a Love wave, even in the case where the thickness of a piezoelectric substrate is small, the influence of a bulk wave on a pass band is small. Thus, also in the case where the thickness of a piezoelectric substrate is reduced and where mirror-surface treatment is performed, the influence of a bulk wave is small. However, in the case where the thickness of a piezoelectric substrate is reduced, it is difficult to reduce the influence of harmonic distortion including intermodulation distortion and the like.

It is assumed that harmonic distortion is generated mainly by, for example, a very small thickness vibration of a piezoelectric substrate in a frequency band from a resonant frequency to an anti-resonant frequency. In various preferred embodiments of the present invention, it is assumed that, since irregularities are located on the second main surface, the influence of the above-mentioned thickness vibration is reduced, and harmonic distortion is suppressed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate that includes first and second main surfaces internally facing each other;
   an elastic-wave element that includes plurality of interdigital transducer (IDT) electrodes provided on or in the first main surface of the piezoelectric substrate; and
   a protective film that is provided on the first main surface of the piezoelectric substrate so as to cover the plurality of IDT electrodes; wherein
   each of the plurality of IDT electrodes includes a main electrode layer made of a metal having a density higher than a density of the protective film;
   the piezoelectric substrate has a thickness of about 0.35 mm or smaller;
   irregularities are located on the second main surface of the piezoelectric substrate;
   the elastic wave device is connected to an antenna; and
   when a wavelength of an elastic wave defined by a pitch of electrode fingers of one of the plurality of IDT electrodes that is closest to the antenna is λ, a thickness of the piezoelectric substrate is 42λ or smaller.

2. The elastic wave device according to claim 1, wherein the elastic-wave element defines one of a ladder filter and a longitudinally coupled resonator elastic wave filter.

3. The elastic wave device according to claim 1, wherein the thickness of the piezoelectric substrate is about 0.18 mm or smaller.

4. The elastic wave device according to claim 1, wherein an arithmetic mean roughness of the irregularities on the second main surface of the piezoelectric substrate is about 115 nm or larger and about 2,000 nm or smaller.

5. The elastic wave device according to claim 1, wherein the piezoelectric substrate and the elastic-wave element are structured to generate one of a Rayleigh wave and a Love wave.

6. The elastic wave device according to claim 1, wherein the protective film includes a silicon oxide as a main component.

7. The elastic wave device according to claim 1, wherein the surface irregularities include roughened surface portions.

8. The elastic wave device according to claim 1, wherein the pitch of the electrode fingers of the one of the plurality of IDT electrodes is about 4.3 μm.

9. The elastic wave device according to claim 1, further comprising another protective film provided on the protective film.

10. The elastic wave device according to claim 9, wherein the another protective film is a frequency adjustment film.

11. The elastic wave device according to claim 9, wherein the another protective film is made of SiN.

12. The elastic wave device according to claim 1, wherein the main electrode layer is made of Pt.

13. The elastic wave device according to claim 1, wherein the elastic wave device has one of a wafer level package (WLP) structure and a chip size package (CSP) structure.

14. The elastic wave device according to claim 1, further comprising a support on the piezoelectric substrate.

15. The elastic wave device according to claim 14, wherein the support includes a cavity which surrounds the plurality of IDT electrodes.

16. The elastic wave device according to claim 14, wherein the protective film and an additional film are provided between the support and the piezoelectric substrate.

17. The elastic wave device according to claim 16, wherein the protective film and the additional film are provided in the cavity.

18. The elastic wave device according to claim 14, wherein a cover is provided on the support.

19. The elastic wave device according to claim 18, wherein via electrodes extend through the support and the cover.

* * * * *